United States Patent
Sung et al.

(10) Patent No.: US 10,854,510 B2
(45) Date of Patent: Dec. 1, 2020

(54) TITANIUM SILICIDE FORMATION IN A NARROW SOURCE-DRAIN CONTACT

(71) Applicant: GLOBALFOUNDRIES INC., Grand Cayman (KY)

(72) Inventors: Min Gyu Sung, Latham, NY (US); Kwanyong Lim, Niskayuna, NY (US); Hiroaki Niimi, Cohoes, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/687,455

(22) Filed: Aug. 26, 2017

(65) Prior Publication Data

US 2017/0372949 A1    Dec. 28, 2017

Related U.S. Application Data

(62) Division of application No. 14/314,670, filed on Jun. 25, 2014, now Pat. No. 9,779,987.

(51) Int. Cl.
| | |
|---|---|
| *H01L 21/768* | (2006.01) |
| *H01L 23/532* | (2006.01) |
| *H01L 21/285* | (2006.01) |
| *H01L 29/417* | (2006.01) |
| *H01L 23/485* | (2006.01) |

(52) U.S. Cl.
CPC .. *H01L 21/76846* (2013.01); *H01L 21/28518* (2013.01); *H01L 21/76855* (2013.01); *H01L 21/76856* (2013.01); *H01L 23/485* (2013.01); *H01L 29/41766* (2013.01); *H01L 23/53266* (2013.01); *H01L 2924/0002* (2013.01)

(58) Field of Classification Search
CPC ......... H01L 21/28518; H01L 21/76846; H01L 21/76855; H01L 21/76856; H01L 23/485; H01L 23/53266; H01L 29/66545
See application file for complete search history.

(56) References Cited

U.S. PATENT DOCUMENTS

| | | |
|---|---|---|
| 5,552,340 A | 9/1996 | Lee et al. |
| 6,509,254 B1 | 1/2003 | Matsumoto et al. |
| 2002/0019127 A1 | 2/2002 | Givens |
| 2008/0087966 A1* | 4/2008 | Tai ............... H01L 21/82384 257/369 |

(Continued)

OTHER PUBLICATIONS

Siew et al., "Adsorption and reaction of NH3 on Ti/Si(1 0 0)", Applied Surface Science 173, 2001, pp. 95-102.

(Continued)

*Primary Examiner* — Joseph M Galvin, III
(74) *Attorney, Agent, or Firm* — Williams Morgan, P.C.

(57) ABSTRACT

Aspects of the present invention relate to approaches for forming a narrow source-drain contact in a semiconductor device. A contact trench can be etched to a source-drain region of the semiconductor device. A titanium liner can be deposited in this contact trench such that it covers substantially an entirety of the bottom and walls of the contact trench. An x-metal layer can be deposited over the titanium liner on the bottom of the contact trench. A titanium nitride liner can then be formed on the walls of the contact trench. The x-metal layer prevents the nitriding of the titanium liner on the bottom of the contact trench during the formation of the nitride liner.

20 Claims, 7 Drawing Sheets

(56) References Cited

U.S. PATENT DOCUMENTS

2014/0054782 A1    2/2014  Morita et al.
2015/0235956 A1*  8/2015  Lin .................. H01L 21/76831
                                                                      257/757

OTHER PUBLICATIONS

Office Action dated Jun. 17, 2015 in co-pending U.S. Appl. No. 14/314,670, filed Jun. 25, 2014.
Office Action dated Dec. 30, 2015 in co-pending U.S. Appl. No. 14/314,670, filed Jun. 25, 2017.
Office Action dated Jan. 24, 2017 in co-pending U.S. Appl. No. 14/314,670, filed Jun. 25, 2017.

* cited by examiner

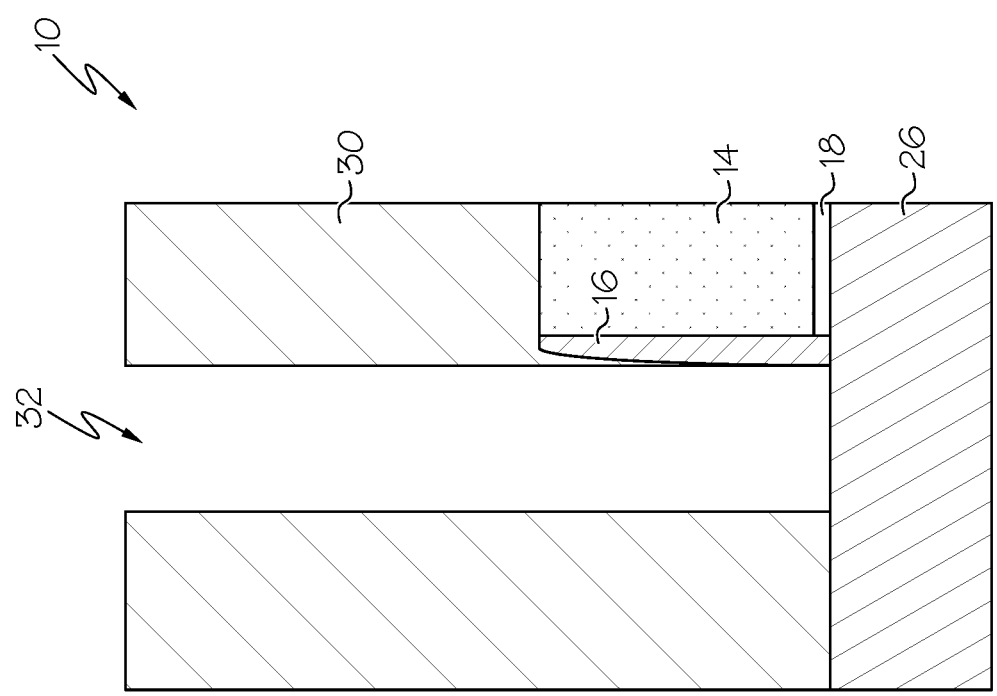

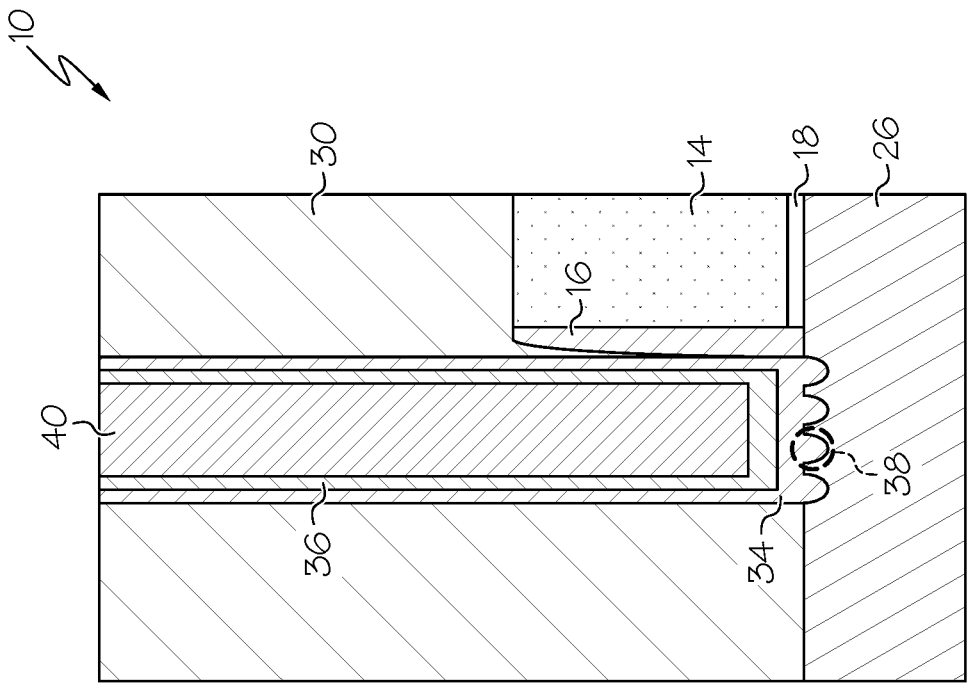
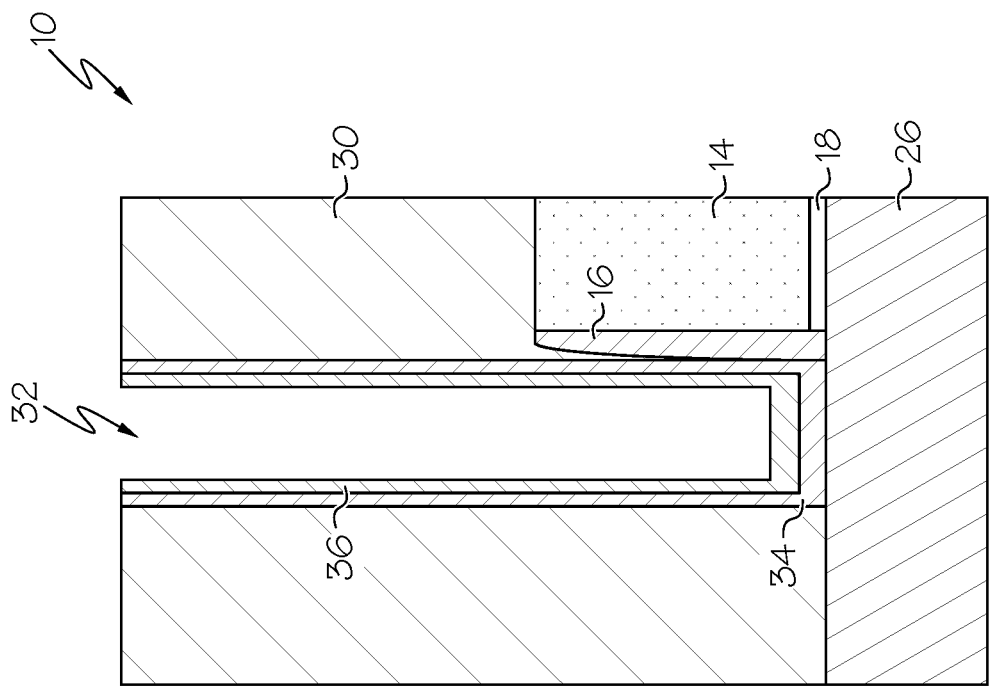

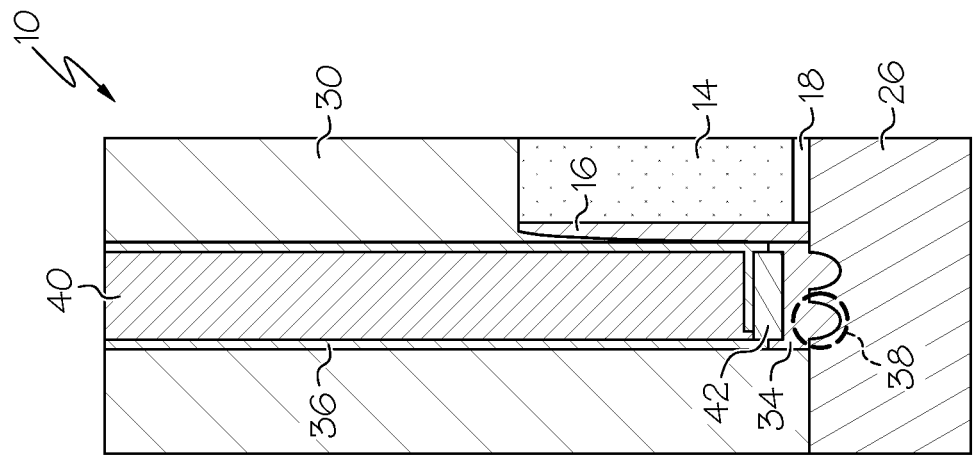
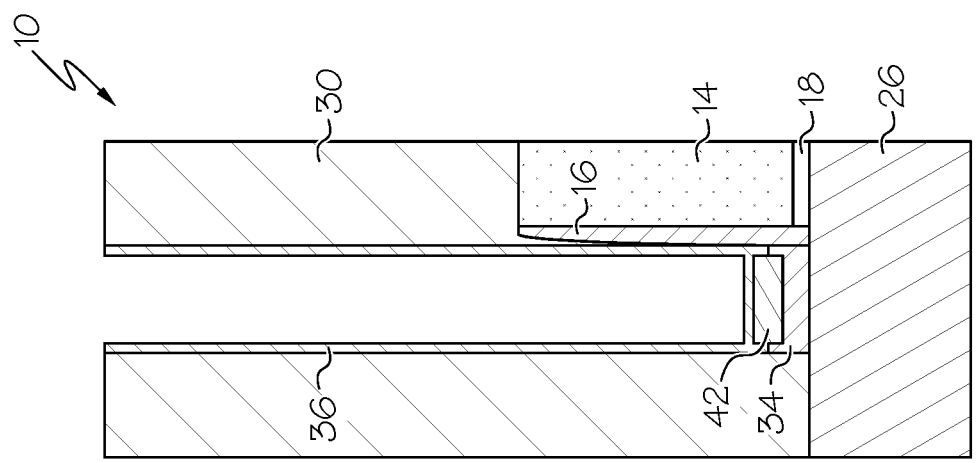

TITANIUM SILICIDE FORMATION IN A NARROW SOURCE-DRAIN CONTACT

BACKGROUND

Technical Field

This invention relates generally to the field of semiconductors and, more particularly, to approaches for forming a contact to a source-drain region.

Related Art

During fabrication, semiconductor devices such as field effect transistors (FETs) often include a stage in which a contact is formed to a source-drain region of the semiconductor device. In most applications, it is understood that low-resistance, stable ohmic contacts are critical for the performance and reliability of the semiconductor device. Conversely, poorly prepared junctions to semiconductors can show rectifying behavior by causing depletion of the semiconductor device near the junction, reducing the performance of the device. Because of the importance of the contacts, care is usually taken to insure that the materials and processes that best achieve the desired results are used.

Process dimensions of semiconductor devices continue to shrink, with increasingly more features being Included on a single chip. As a result of this miniaturization, materials and/or processes that were once standard may provide unpredictable results or may cease to work altogether.

SUMMARY

In general, aspects of the present invention relate to approaches for forming a narrow source-drain contact in a semiconductor device. A contact trench can be etched to a source-drain region of the semiconductor device. A titanium liner can be deposited in this contact trench such that it covers substantially an entirety of the bottom and walls of the contact trench. An x-metal layer can be deposited over the titanium liner on the bottom of the contact trench. A titanium nitride liner can then be formed on the walls of the contact trench. The x-metal layer prevents the nitriding of the titanium liner on the bottom of the contact trench during the formation of the nitride liner.

A first aspect of the present invention provides a method for forming a narrow source-drain contact in a semiconductor device, comprising: etching a contact trench to a source-drain region of the semiconductor device; depositing a titanium liner in the contact trench, the titanium liner covering substantially an entirety of a bottom and walls of the contact trench; depositing an x-metal layer over the titanium liner on the bottom of the contact trench; and forming a titanium nitride liner on substantially an entirety of the walls of the contact trench, wherein the x-metal layer prevents a nitriding of the titanium liner on the bottom of the contact trench.

A second aspect of the present invention provides a method for forming a semiconductor device, comprising: forming a source-drain region, a replacement metal gate, and an inter-layer dielectric layer on a substrate; etching a contact trench that is less than 30 nm in width through the inter-layer dielectric layer to the source-drain region; depositing a titanium liner in the contact trench, the titanium liner covering substantially an entirety of a bottom and walls of the contact trench; depositing an x-metal layer over the titanium liner on the bottom of the contact trench; forming a titanium nitride liner on substantially an entirety of the walls of the contact trench, and forming a contact to the source-drain region in the contact trench, wherein the x-metal layer prevents a nitriding of the titanium liner on the bottom of the contact trench, and wherein the titanium nitride liner binds the contact to the walls of the contact trench.

A third aspect of the present invention provides a semiconductor device, formed via a process, comprising: forming a source-drain region, a replacement metal gate, and an inter-layer dielectric layer on a substrate; etching a contact trench that is less than 30 nm in width through the inter-layer dielectric layer to the source-drain region; depositing a titanium liner in the contact trench, the titanium liner covering substantially an entirety of a bottom and walls of the contact trench; depositing an x-metal layer over the titanium liner on the bottom of the contact trench, wherein the x-metal layer comprises at least one of: platinum, hafnium, cobalt, nickel, or tungsten; forming a titanium nitride liner on substantially an entirety of the walls of the contact trench, and forming a tungsten contact to the source-drain region in the contact trench, wherein the x-metal layer prevents a nitriding of the titanium liner on the bottom of the contact trench, and wherein the titanium nitride liner binds the tungsten contact to the walls of the contact trench.

BRIEF DESCRIPTION OF THE DRAWINGS

These and other features of this invention will be more readily understood from the following detailed description of the various aspects of the invention taken in conjunction with the accompanying drawings in which:

FIG. 2 shows an etching of a contact trench according to an embodiment of the present invention;

FIGS. 3A-B show a prior art forming of a source-drain contact in the device of FIG. 2;

FIG. 7A-B show a forming of a titanium nitride liner in the device of FIG. 5B according to an embodiment of the present invention.

Figure 1:
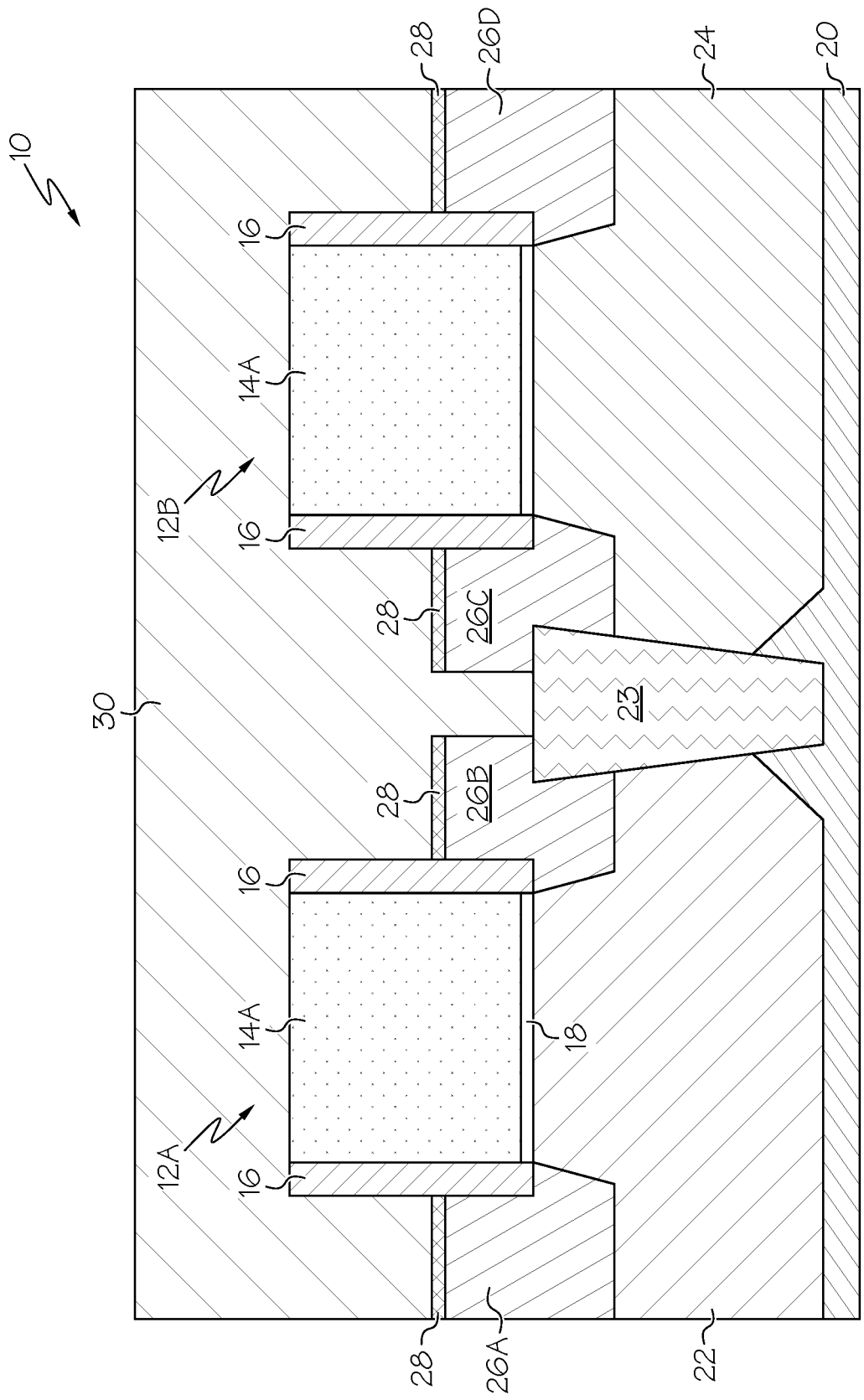
FIG. 1 shows a semiconductor device according to an embodiment of the present invention.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Illustrative embodiments will now be described more fully herein with reference to the accompanying drawings, in which embodiments are shown. This disclosure may, however, be embodied in many different forms and should not be construed as limited to the embodiments set forth herein. Rather, these embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" is intended to mean a quantity of at least one. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer) is present on a second element, such as a second structure (e.g. a second layer) wherein intervening elements, such as an interface structure (e.g. interface layer) may be present between the first element and the second element.

As used herein, "depositing" may include any now known or later developed techniques appropriate for the material to be deposited including, but not limited to, for example: chemical vapor deposition (CVD), low-pressure CVD (LPCVD), plasma-improved CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation, etc.

As indicated above, aspects of the present invention relate to approaches for forming a narrow source-drain contact in a semiconductor device. A contact trench can be etched to a source-drain region of the semiconductor device. A titanium liner can be deposited in this contact trench such that it covers substantially an entirety of the bottom and walls of the contact trench. An x-metal layer can be deposited over the titanium liner on the bottom of the contact trench. A titanium nitride liner can then be formed on the walls of the contact trench. The x-metal layer prevents the nitriding of the titanium liner on the bottom of the contact trench during the formation of the nitride liner.

Referring now to FIG. 1, a cross-sectional view of a semiconductor device 10 according to an embodiment of the present invention is shown. As depicted, device 10 may include a set of gate stacks 12A-B formed over a substrate 20. Gate stacks 12A-B may include dummy gates 14A-B (e.g., polysilicon, SiOC, SiOCN, and/or the like), spacers 16, a gate dielectric 18, and/or a liner layer (not shown).

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type of semiconductor layers formed thereover or associated therewith. A portion or entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped, or contain doped regions and undoped regions therein. The semiconductor substrate may contain regions with strain and regions without strain therein, or contain regions of tensile strain and compressive strain.

As further shown, device 10 may include NFET region 22, PFET region 24, isolation region 23, raised source-drains (RSDs) 26A-D, which can include one or more phosphorus silicon (SiP) regions, one or more silicon germanium (SiGe) regions, and/or the like. It is understood that the specifying of portions of RSD 26A-D in accordance with use of certain materials (e.g., SiP and SiGe) should not be seen as limiting, but, rather, use of any materials now known or later developed as being adapted for use in RSDs 26A-D is envisioned. As further shown in FIG. 1, an inter-layer dielectric (ILD) 34 can also be deposited over semiconductor device 10 (e.g., over gate stacks 12A, 12B, RSDs 26A-D, etc.) and polished (e.g., via chemical-mechanical polishing (CMP)). It is understood that these layers/components are intended to be illustrative only and that other layers and/or materials may exist in device 10.

In making semiconductor device 10, dummy gates (14A-B) can be removed from semiconductor device 10, and a set of gates (not shown) can be formed in forming gate region/areas in place of dummy gates (14A-B). These gates can be replacement metal gates and can be formed by depositing a series of gate material layers, which can include an oxide stack, including, but not limited to, Hafnium Oxide, covered by one or more work-function metal layers, which can include, but not be limited to: Ti, TiN, Ta, TaN, TiAl, Al, TiC, W, and/or the like. Additionally or in the alternative, any other solution now known or later discovered can be utilized (e.g., a metal gate of a single uniform substance).

Referring now to FIG. 2, a contact trench 32 can be formed to RSD 26A-D (FIG. 1). For example, one or more layers, including one or more of, but not limited to, an encapsulation layer, a patterning sacrificial layer, and/or a hardmask layer can be formed over semiconductor device 10, using any solution. Then contact trench 32 can be etched using the hardmask layer (e.g., a photoresist) as a guide. This contact trench 32 can be formed in a single uninterrupted process or series of processes that etch through the patterning sacrificial layer, if present, through the encapsulation layer, if present, through IDL 30, and through spacer 28, if present, to silicon forming RSD 26. Then, the hardmask layer can be removed using a chemical hardmask strip or using any process now known or later developed.

Referring now to FIGS. 3A-B, a prior art forming of a source-drain contact 40 in the device of FIG. 2 is shown. As illustrated, a titanium liner 34 is deposited on the bottom and walls of contact trench 32, as shown in FIG. 3A. This depositing of titanium liner 34 in contact trench 32 can be performed using a physical vapor deposition (PVD) process or an atomic layer deposition (ALD) process. Then, a titanium nitride liner 36 is deposited in contact trench 32 directly over titanium liner 34. This depositing of titanium nitride liner 36 can be performed using a physical vapor deposition (PVD) process or an atomic layer deposition (ALD) process. Then a contact 40 (e.g., comprising tungsten) can be formed in contact trench 32, such as by a CVD fill procedure. In this prior art process, the titanium liner 34 reacts with the silicon in RSD 26 to form titanium silicide 38 during a downstream process thermal budget. This titanium silicide 38 provides enhanced properties for contact 40 with RSD 38. The depositing of titanium nitride liner 36 serves to cap titanium liner 34 and provide a "glue" that binds the tungsten contact 40 with the walls of contact trench 32.

The inventors of the current invention have discovered that the prior art processes described heretofore suffer deficiencies as the form factor of the semiconductor device 10 decreases. For example, as the width of contact trench 32 falls below 30 nm, attempts to deposit titanium nitride liner 36 using a PVD process will lead to titanium nitride liner 36 not adhering to the walls of contact trench 32 due to a very small contact CD. The absence of titanium nitride liner 36 can result in the tungsten forming contact 40 being flaked due to a low adhesion to the oxide forming ILD 30. Conversely, attempts to compensate by applying a thicker layer of titanium nitride liner 36 can result in the amount of titanium nitride liner 36 in the bottom of contact trench 32 becoming thicker, which can lead to high contact resistance. Furthermore, when an ALD process is used in a contact trench 32 having a width below 30 nm, the titanium in titanium liner 34 can become nitrided in the $NH_3$ environment used to perform the titanium nitride liner 36 deposition. This can cause titanium liner 34 not to react as readily with the silicon in RSD 38 and make formation of titanium silicide 38 more difficult, increasing contact resistance.

The present invention utilizes an x-metal layer between the titanium liner 34 and the titanium nitride liner 36. This x-metal layer prevents titanium liner 34 on the bottom of contact trench 32 from being nitrided during formation of titanium nitride liner 36. To this extent, x-metal that forms the x-metal layer can be any metal that does not react with titanium, such as during the deposition and/or the downstream thermal budget. Such include, but are not limited to, platinum, hafnium, cobalt, nickel, tungsten, and/or the like. In any case, the x-metal layer can be in a variety of formulations in combination with titanium liner 34 and titanium nitride liner 36. As such, the following example embodiments should be understood as being illustrative and should not be seen as limiting.

Example Embodiment #1

Figure 4C:
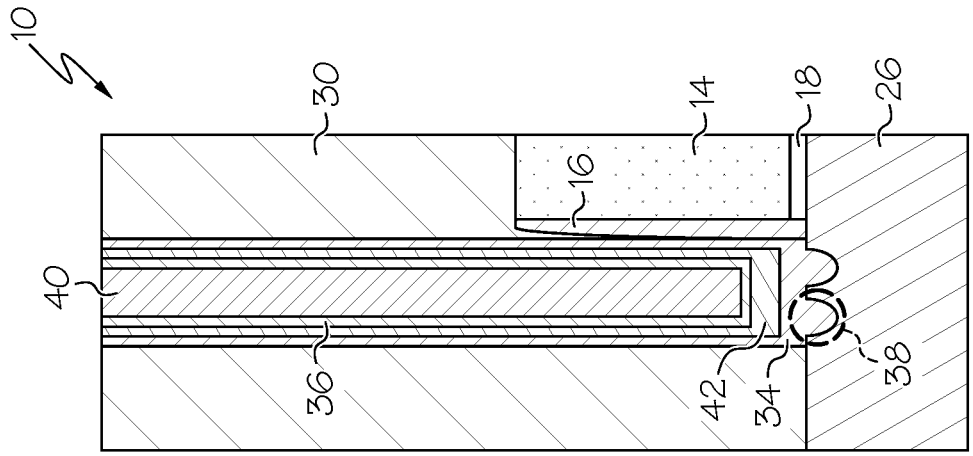
FIGS. 4A-C shows a forming of a narrow source-drain contact in the device of FIG. 2 according to an embodiment of the present invention.
Figure 4B:
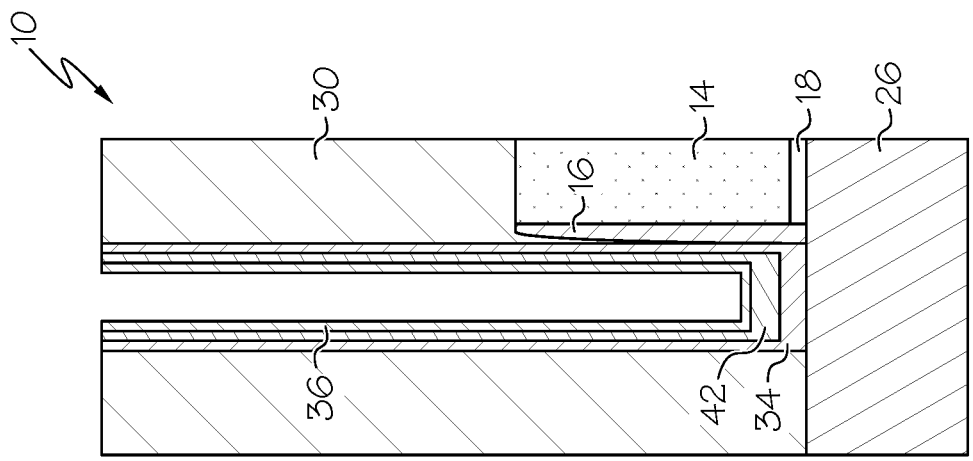
Figure 4A:
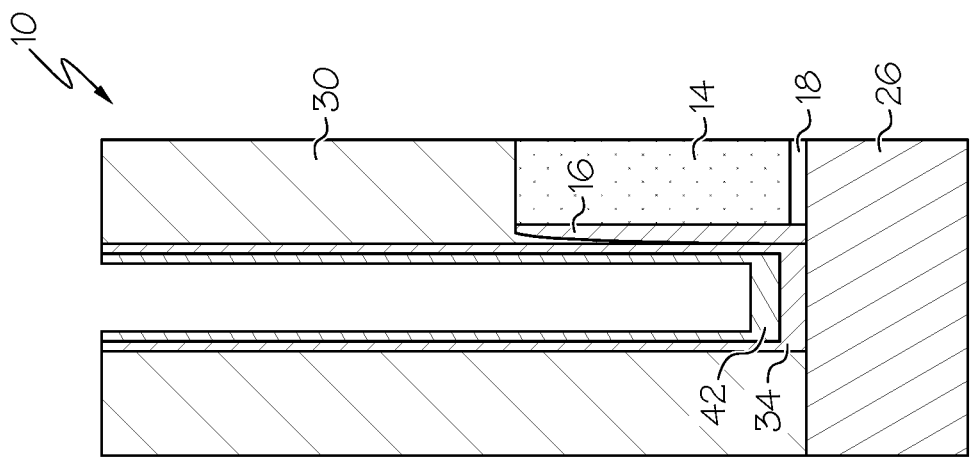

Referring now to FIGS. 4A-C, a forming of a narrow source-drain contact 40 in the device of FIG. 2 is shown according to an embodiment of the present invention. As shown, titanium liner 34 is deposited on the bottom and (optionally) on the walls of contact trench 32, as shown in FIG. 4A. This depositing of titanium liner 34 in contact trench 32 can be performed using a PVD process (bottom only) or an ALD process (bottom and walls). Then, an x-metal layer 42 is deposited over titanium liner 34 on substantially an entirety of the bottom and (optionally) walls of contact trench 32. As with titanium liner 34, x-metal layer 42 can be deposited in contact trench 32 using a PVD process (bottom only) or an ALD process (bottom and walls). However, it should be understood that x-metal layer 42 is usually deposited on the walls of contact trench 32 only in cases in which titanium liner 34 has previously been deposited on the walls of contact trench 32.

Then, as shown in FIG. 4B, titanium nitride liner 36 can be formed by depositing the titanium nitride liner 36 on substantially an entirety of the bottom and walls of the contact trench 32, covering x-metal layer 42. Titanium nitride liner 36 can be deposited using an ALD process, such that both the bottom and walls of contact trench 32 are substantially covered. Thus, as shown in FIG. 4C, subsequently formed tungsten contact 40 binds with titanium nitride liner 36 to adhere to the walls of contact trench 32. Further, because $NH_3$ used to form titanium nitride liner 36 is blocked from reaching titanium liner 34 in the bottom of contact trench 32 by x-metal layer 42, the titanium in the bottom of contact trench 32 is not nitrided and is free to subsequently react with the silicon in RSD 26 to form titanium silicide 38.

Example Embodiment #2

Figure 5A:
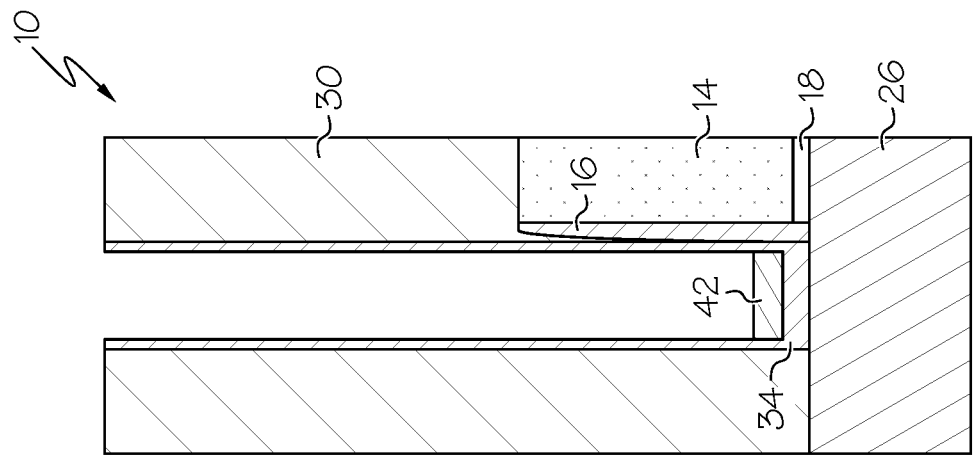
FIGS. 5A-B show a forming of a titanium liner and an x-metal layer in the device of FIG. 2 according to an embodiment of the present invention.
Figure 5B:
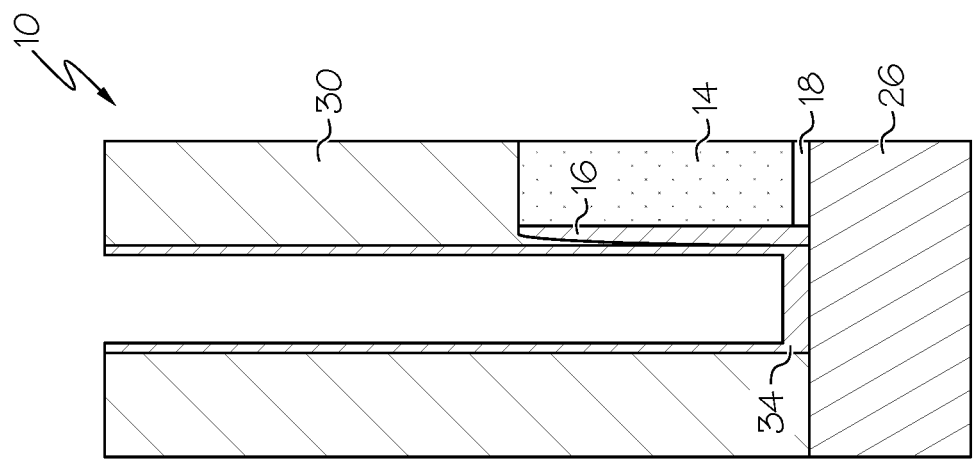

Referring now to FIGS. 5A-B and 6A-C, a forming of a narrow source-drain contact 40 in the device of FIG. 2 is shown according to an embodiment of the present invention. As shown in FIG. 5A, titanium liner 34 is deposited in contact trench 32, covering substantially an entirety of the bottom and walls of the contact trench. This depositing of titanium liner 34 in contact trench 32 can be performed using an ALD process to cover both the bottom and walls of contact trench 32. Then, as shown in FIG. 5B, x-metal layer 42 is deposited over titanium liner 34 on substantially an entirety of the bottom of contact trench 32. In contrast to titanium liner 34, x-metal layer 42 is deposited in contact trench 32 using a PVD process so that there is no deposit of x-metal on the wall of contact trench 32.

Figure 6C:
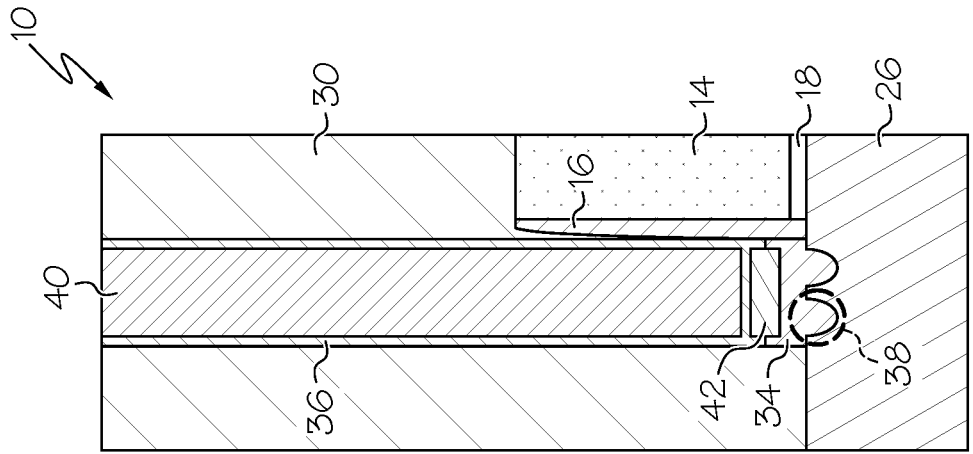
FIGS. 6A-C show a forming of a titanium nitride liner in the device of FIG. 5B according to an embodiment of the present invention.
Figure 6B:
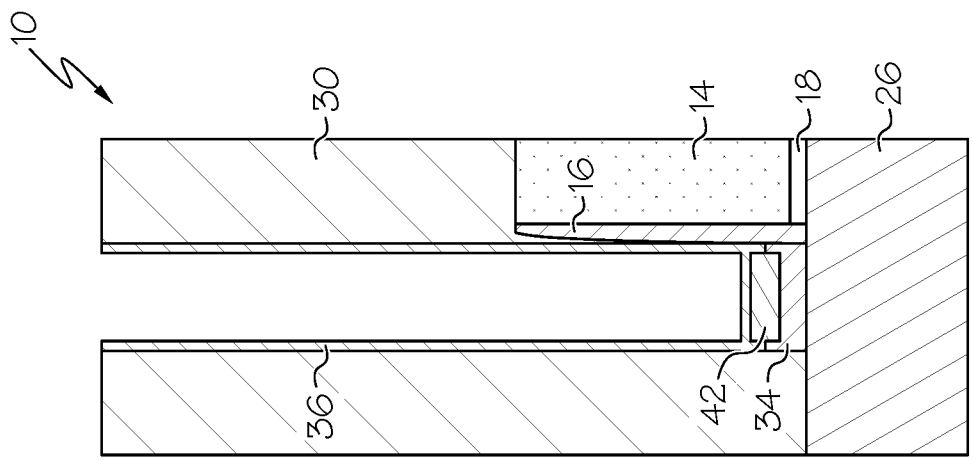
Figure 6A:
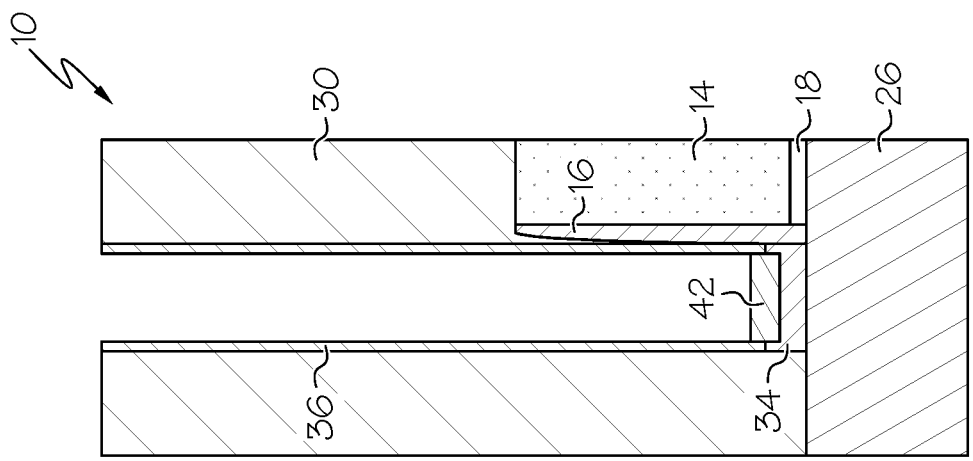

Then, as shown in FIG. 6A, titanium nitride liner 36 can be formed by nitriding a portion of titanium liner 34 previously deposited on the walls of contact trench 32. This can be accomplished by performing an annealing process on the titanium liner 34 using nitrogen, $NH_3$, or a combination thereof. Then, as shown in FIG. 6B, a layer of titanium nitride liner 34 can be deposited over x-metal layer 42 on the bottom of contact trench 32 via a PVD process, covering x-metal layer 42. As in the previous example, subsequently formed tungsten contact 40 binds with titanium nitride liner 36 to adhere to the walls of contact trench 32, as shown in FIG. 6C. Further, because the nitrogen and/or $NH_3$ used in the annealing process used to transform titanium liner 34 on the sides of contact trench 32 into titanium nitride liner 36 is blocked from reaching titanium liner 34 in the bottom of contact trench 32 by x-metal layer 42, the titanium in the bottom of contact trench 32 is not nitrided and is free to subsequently react with the silicon in RSD 26 to form titanium silicide 38.

Example Embodiment #3

Referring now to FIGS. 5A-B and 7A-B, a forming of a narrow source-drain contact 40 in the device of FIG. 2 is shown according to an embodiment of the present invention. As in the previous example, titanium liner 34 is deposited in contact trench 32, covering substantially an entirety of the bottom and walls of the contact trench, as shown in FIG. 5A. This depositing of titanium liner 34 in contact trench 32 can be performed using an ALD process to cover both the bottom and walls of contact trench 32. Then, as shown in FIG. 5B, x-metal layer 42 is deposited over titanium liner 34 on substantially an entirety of the bottom of contact trench 32. In contrast to titanium liner 34, x-metal layer 42 is deposited in contact trench 32 using a PVD process so that there is no deposit of x-metal on the walls of contact trench 32.

Then, as shown in FIG. 7A, titanium nitride liner 36 can be formed by nitriding a portion of titanium liner 34 previously deposited on the walls of contact trench 32. However, in contrast to the previous example, this can be accomplished simultaneously with the depositing of titanium nitride liner 36 over x-metal layer 42 on the bottom of contact trench 32. For example, titanium nitride liner 36 can be deposited over x-metal layer 42 on the bottom of contact trench 32 via a reactive sputtering PVD process in an $N_2$ ambient environment. This process will also simultaneously nitride the portion of titanium liner 34 deposited on the walls of contact trench 32. As in the previous examples, subsequently formed tungsten contact 40 binds with titanium nitride liner 36 to adhere to the walls of contact trench 32, as shown in FIG. 7B. Further, because the nitrogen and/or $NH_3$ used in the annealing process used to transform titanium liner 34 on the sides of contact trench 32 into titanium nitride liner 36 is blocked from reaching titanium liner 34 in the bottom of contact trench 32 by x-metal layer 42, the titanium in the bottom of contact trench 32 is not nitrided and is free to subsequently react with the silicon in RSD 26 to form titanium silicide 38.

In various embodiments, design tools can be provided and configured to create the data sets used to pattern the semiconductor layers as described herein. For example, data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware modules, or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines, or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention.

Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A semiconductor device, formed via a process, comprising:
   forming a source-drain region, a replacement metal gate, and an inter-layer dielectric layer on a substrate;
   etching a contact trench that is less than 30 nm in width through the inter-layer dielectric layer to the source-drain region;
   depositing a titanium liner in the contact trench, the titanium liner covering substantially an entirety of a bottom and walls of the contact trench;
   depositing an x-metal layer over the titanium liner on the bottom of the contact trench, wherein the x-metal layer comprises at least one of: platinum, hafnium, cobalt, nickel, or tungsten;
   forming a titanium nitride liner on substantially an entirety of the walls of the contact trench, and
   forming a tungsten contact to the source-drain region in the contact trench,
   wherein the x-metal layer prevents a nitriding of the titanium liner on the bottom of the contact trench, and
   wherein the titanium nitride liner binds the tungsten contact to the walls of the contact trench.

2. The semiconductor device of claim 1, the process further comprising:
   depositing the x-metal layer over the titanium liner on substantially an entirety of the walls of the contact trench; and
   depositing the titanium nitride liner over the x-metal layer on substantially an entirety of the walls of the contact trench,
   wherein the depositing of each of the titanium liner, the x-metal layer, and the titanium nitride liner is performed via an atomic layer deposition (ALD) process.

3. The semiconductor device of claim 1, wherein the forming of the titanium nitride liner further comprises:
   annealing a portion of the titanium liner deposited on the walls of the contact trench with at least one of N or $NH_3$ to form a portion of the titanium nitride liner on the walls of the contact trench, and
   depositing titanium nitride over the x-metal layer on the bottom of the contact trench via a physical vapor deposition (PVD) process, to form a portion of the titanium nitride liner on the bottom of the contact trench.

4. The semiconductor device of claim 1, wherein the forming of the titanium nitride liner further comprises:

depositing the titanium nitride liner over the x-metal layer on the bottom of the contact trench via a reactive sputtering physical vapor deposition (PVD) process in an $N_2$ ambient environment, to form a portion of the titanium nitride liner on the bottom of the contact trench, wherein the reactive sputtering PVD process causes a nitriding of a portion of the titanium liner deposited on the walls of the contact trench.

5. A semiconductor device, comprising:
a source-drain region, a metal gate, and an inter-layer dielectric layer on a substrate;
a contact trench through the inter-layer dielectric layer to the source-drain region;
a titanium liner in the contact trench, the titanium liner covering substantially an entirety of a bottom of the contact trench, wherein the titanium liner is not nitrided;
an x-metal layer over the titanium liner on the bottom of the contact trench;
a titanium nitride liner directly contacting the inter-layer dielectric on substantially an entirety of the walls of the contact trench, and
a contact to the source-drain region in the contact trench and bound by the titanium nitride liner to the walls of the contact trench.

6. The semiconductor device of claim 5, wherein the contact trench is less than 30 nm in width.

7. The semiconductor device of claim 5, wherein the x-metal layer comprises at least one of: platinum, hafnium, cobalt, nickel, or tungsten.

8. The semiconductor device of claim 5, wherein the contact comprises tungsten.

9. The semiconductor device of claim 5, wherein the metal gate is a replacement metal gate.

10. A semiconductor device, comprising:
a source-drain region comprising silicon, a metal gate, and an inter-layer dielectric layer on a substrate;
a contact trench through the inter-layer dielectric layer to the source-drain region;
a titanium liner in the contact trench, the titanium liner covering substantially an entirety of a bottom of the contact trench;
an x-metal layer over the titanium liner on the bottom of the contact trench;
a titanium nitride liner directly contacting the inter-layer dielectric on substantially an entirety of the walls of the contact trench,
a contact to the source-drain region in the contact trench and bound by the titanium nitride liner to the walls of the contact trench; and
a titanium silicide between the titanium liner on the bottom of the contact trench and the source-drain region.

11. The semiconductor device of claim 10, wherein the contact trench is less than 30 nm in width.

12. The semiconductor device of claim 10, wherein the x-metal layer comprises at least one of: platinum, hafnium, cobalt, nickel, or tungsten.

13. The semiconductor device of claim 10, wherein the contact comprises tungsten.

14. The semiconductor device of claim 10, wherein the metal gate is a replacement metal gate.

15. The semiconductor device of claim 1, wherein the x-metal layer comprises platinum.

16. The semiconductor device of claim 1, wherein the x-metal layer comprises hafnium.

17. The semiconductor device of claim 1, wherein the x-metal layer comprises cobalt.

18. The semiconductor device of claim 1, wherein the x-metal layer comprises nickel.

19. The semiconductor device of claim 1, wherein the x-metal layer comprises tungsten.

20. The semiconductor device of claim 3, wherein the annealing the portion of the titanium liner deposited on the walls of the contact trench to form a portion of the titanium nitride liner on the walls of the contact trench is with nitrogen.

* * * * *